(12) United States Patent
Mandelman et al.

(10) Patent No.: US 7,262,451 B2
(45) Date of Patent: Aug. 28, 2007

(54) HIGH PERFORMANCE EMBEDDED DRAM TECHNOLOGY WITH STRAINED SILICON

(75) Inventors: Jack A. Mandelman, Flat Rock, NC (US); Jeffrey P. Gambino, Westford, VT (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 10/541,660

(22) PCT Filed: Jan. 8, 2003

(86) PCT No.: PCT/US03/00562

§ 371 (c)(1),
(2), (4) Date: Jul. 6, 2005

(87) PCT Pub. No.: WO2004/064148

PCT Pub. Date: Jul. 29, 2004

(65) Prior Publication Data

US 2006/0024877 A1    Feb. 2, 2006

(51) Int. Cl.
*H01L 27/108* (2006.01)
(52) U.S. Cl. .................................. 257/301; 438/386

(58) Field of Classification Search ............ 257/18–20, 257/65, 301, 616, E29.193, E21.092, E21.102, 257/E21.105, E31.035, E31.046, E31.049, 257/E27.091, E27.092, E29.346, E21.396, 257/E21.651; 438/243, 386, 933
See application file for complete search history.

(56) References Cited

U.S. PATENT DOCUMENTS

| 5,250,448 | A  | 10/1993 | Hamasaki et al. |
| 5,323,031 | A  | 6/1994  | Shoji et al. |
| 6,509,587 | B2 | 1/2003  | Sugiyama et al. |
| 6,891,209 | B2 * | 5/2005 | Bulsara et al. .............. 257/222 |
| 2003/0017667 | A1 | 1/2003 | Park et al. |
| 2003/0030091 | A1 | 2/2003 | Bulsara et al. |

\* cited by examiner

*Primary Examiner*—David Vu
(74) *Attorney, Agent, or Firm*—Ira D. Blecker

(57) ABSTRACT

Semiconductor devices are fabricated in a strained layer region and strained layer-free region of the same substrate. A first semiconductor device, such as a memory cell, e.g. a deep trench storage cell, is formed in a strained layer-free region of the substrate. A strained layer region is selectively formed in the same substrate. A second semiconductor device (66, 68, 70), such as an FET, e.g. an MOSFET logic device, is formed in the strained layer region.

14 Claims, 4 Drawing Sheets

HIGH PERFORMANCE EMBEDDED DRAM TECHNOLOGY WITH STRAINED SILICON

This is a National Stage Application corresponding to, and claiming priority from, PCT Application Number PCT/US03/00562 filed 8 Jan. 2003.

FIELD OF THE INVENTION

The field of the invention is semiconductor processing. Specifically, the invention relates to forming semiconductor devices in a strained layer region and a strained layer-free region of the same substrate.

BACKGROUND OF THE INVENTION

Semiconductor devices such as Metal-Oxide-Semiconductor Field Effect Transistors (MOSFET's) formed on strained silicon channels have been shown to offer dramatic improvements in mobility and performance. The successful integration of high-performance strained silicon logic type MOSFET's with memory such as dense, low-leakage Dynamic Random Access Memory (DRAM) arrays on the same semiconductor chip for embedded-DRAM applications has not been achieved due to the need to maintain high quality, defect-free silicon in the DRAM array areas while providing strained silicon in the logic support areas. Strained silicon and the substrate required to produce the strain inherently results in greatly increased silicon dislocations, which makes it incompatible with low-leakage DRAM cells. Furthermore, semiconductor processes which exceed certain temperatures that are required for the DRAM cell formation may be incompatible with currently practiced strained silicon formation.

Forming high-performance strained silicon support MOSFETs on the same substrate with low-leakage high-density DRAM cells is desired.

SUMMARY OF THE INVENTION

It is thus an object of the present invention to form high-performance strained silicon support MOSFETs on the same substrate with low-leakage high-density DRAM cells.

The present invention discloses a first semiconductor device such as, for example, a low-leakage DRAM cell, formed in a strained layer-free region of a semiconductor substrate. On the same semiconductor substrate, a strained layer region is selectively formed in the semiconductor substrate separate from the strained layer-free region and a second semiconductor device such as, for example, a high-performance MOSFET, is formed in the strained layer region.

DESCRIPTION OF THE DRAWING

The foregoing and other features of the invention will become more apparent upon review of the detailed description of the invention as rendered below. In the description to follow, reference will be made to the several figures of the accompanying Drawing, in which.

DETAILED DESCRIPTION OF THE PREFERRED EMBODIMENTS OF THE INVENTION

Figure 1:
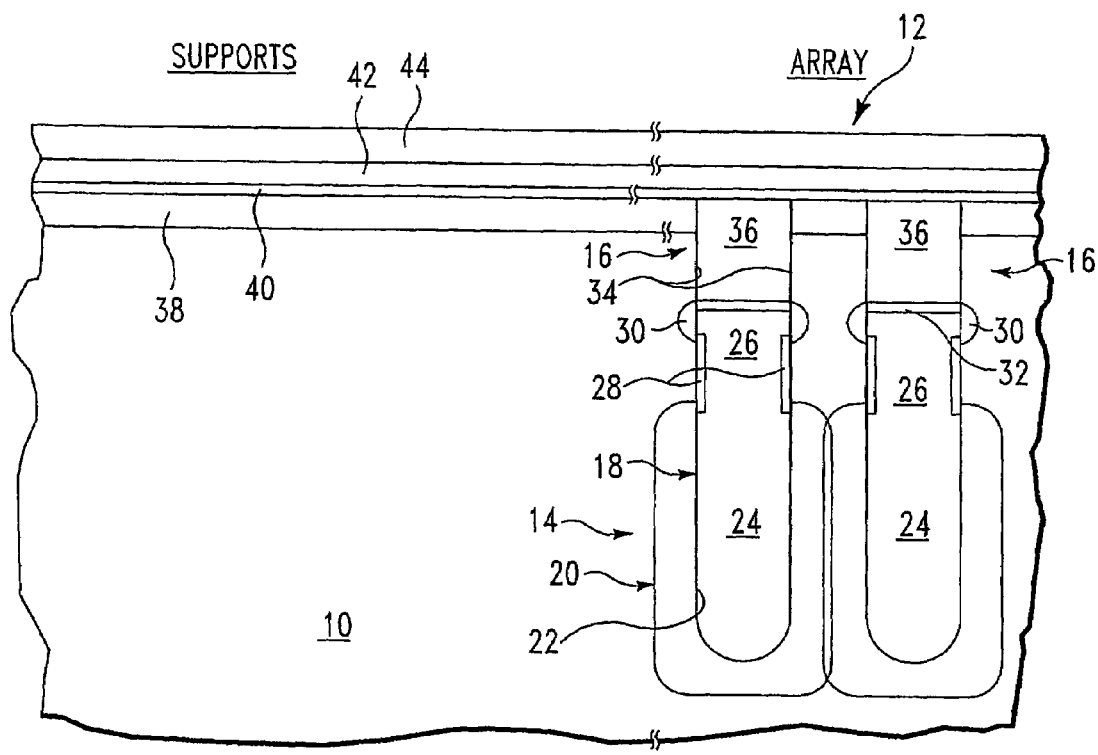
FIGS. 1-8 are cross sectional views of the semiconductor structure as it appears during the steps according to the method of the present invention.

Referring to FIG. 1, p-type silicon substrate 10 is provided having memory cell 12 formed in a strained layer-free region of substrate 10. In FIG. 1, memory cell 12 is a DRAM cell having a trench storage capacitor 14 and vertical MOSFET 16, which can be formed, for example, as described in commonly assigned U.S. Pat. No. 6,225,158 B1, herein incorporated by reference. Although memory cell 12 is shown in FIG. 1 as having a trench storage capacitor 14 and vertical MOSFET 16, it should be noted that memory cell 12 can be formed using other types of capacitors and FET's such as a stacked capacitor or a planar MOSFET. In this example, trench storage capacitor 14 includes: deep trench 18, n+ buried plate 20, nitride/oxide node dielectric 22, n+ polysilicon 24 and 26, collar oxide 28 and n+ buried strap diffusion 30. Further, vertical MOSFET 16 includes: trench top oxide 32, gate oxide 34 formed on the sidewalls of deep trench 18, and n+ polysilicon gate conductor 36. It should be noted that two memory cells 12 are shown in the array region throughout FIGS. 1-8. However, it should be understood that any number of one or more memory cells 12 can be formed in the array region.

After formation of memory cells 12 in strained layer-free regions of substrate 10, strained layer regions are formed in substrate 10 for the subsequent formation of high performance MOSFETS. Thus, process incompatibilities such as high temperatures used in the formation of the memory cells are avoided since the strained layer regions and the MOSFETS are formed after the memory cells are formed.

Figure 2:
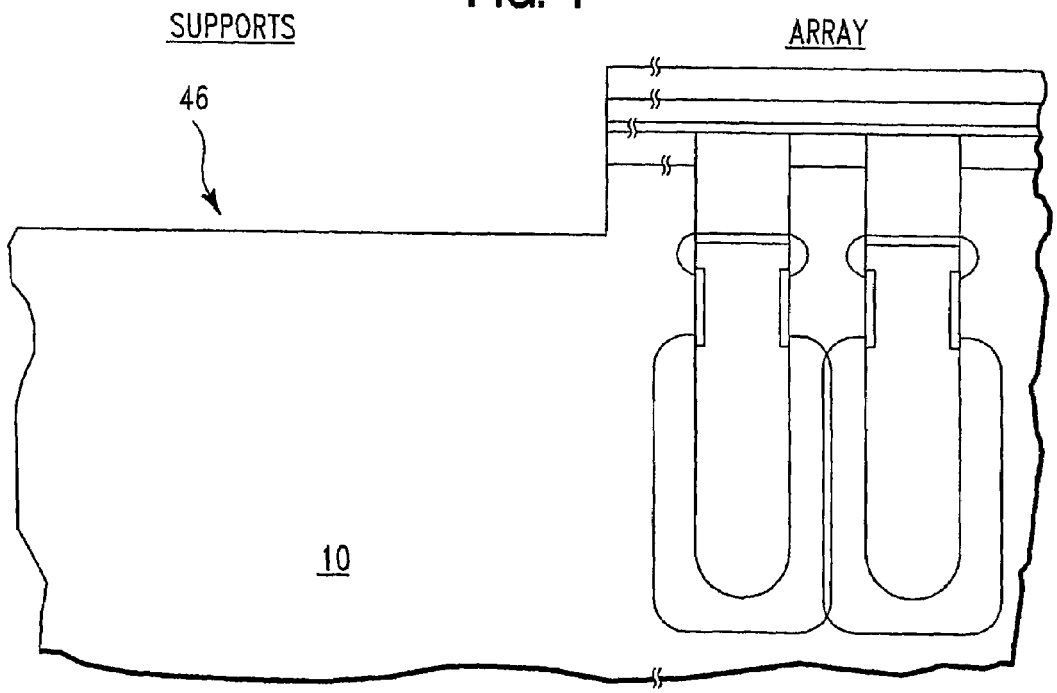

A thin layer 40 (e.g. silicon oxide) is deposited on pad film 38 (which can include, for example, a pad nitride and a pad oxide layer) and exposed portions of gate conductor 36 as shown in FIG. 2. Oxide layer 40 serves as an etch stop layer in subsequent processing.

Another layer 42 (e.g. silicon nitride) is then deposited on oxide layer 40, and a hard mask layer 44 (e.g. silicon oxide) is deposited on silicon nitride layer 42.

A block resist (not shown) is patterned on oxide hard mask layer 44 and a reactive ion etch is used to etch through exposed portions of layers 38, 40, 42,44 and into substrate 10 to a preferred depth of about 100 nm to about 400 nm, more preferably about 200 nm, to form trench 46 as shown in FIG. 2. Any remaining block resist is removed from oxide hard mask layer 44 after the formation of trench 46.

Figure 3:
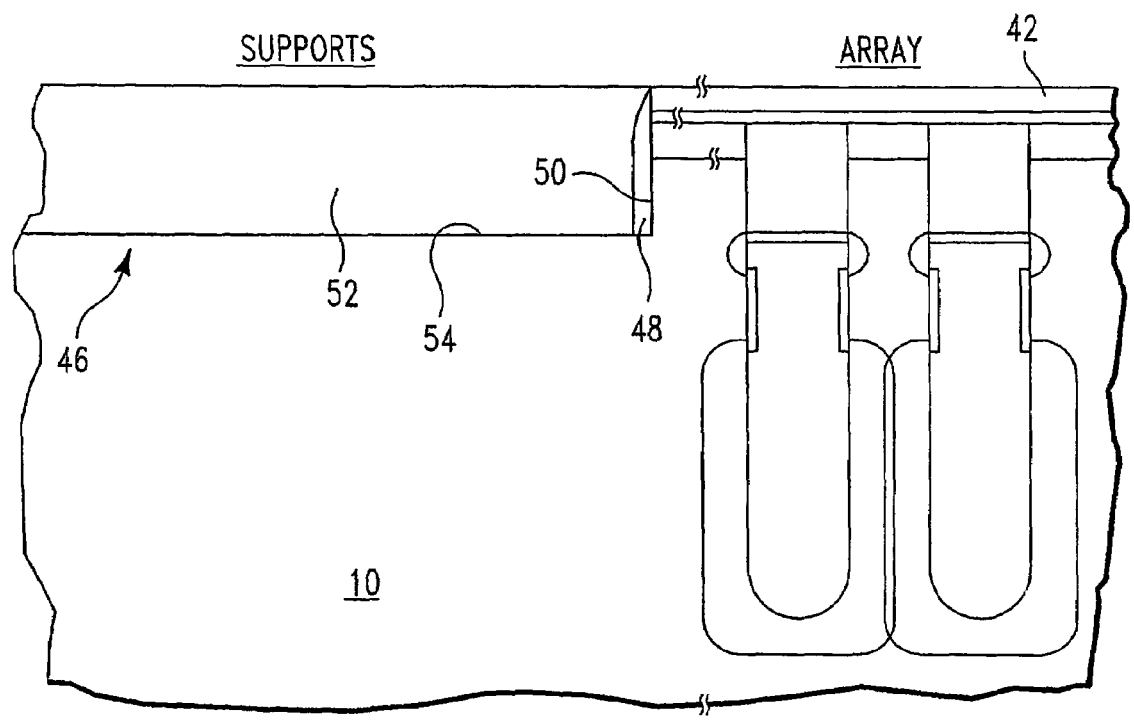

Referring to FIG. 3, oxide hard mask layer 44 is removed by a standard process, such as reactive ion etching selective to silicon nitride layer 42 and silicon exposed by trench 46. Spacer 48 comprising a material upon which silicon or Silicon Germanium (SiGe) will not nucleate, such as silicon oxide or nitride, is formed on sidewall surface 50 of trench 46, such as by conventional deposition and RIE. A linear graded buffer layer technique can be used to grow SiGe layer 52 with low dislocation density (~$10^5$ cm−2) in trench 46. Growth conditions are favored to selectively form SiGe layer 52 on substrate 10, and not on spacer 48. Preferably, SiGe layer 52 is epitaxially grown upward from exposed bottom surface 54 of trench 46 until SiGe layer 52 is above the top surface of silicon nitride layer 42. Overgrown SiGe layer 52 is planarized to the top surface of silicon nitride layer 42 by a process such as chemical mechanical polishing (CMP). Silicon CMP processes that are known in the art can be used to planarize SiGe layer 52.

Optionally, spacer 48 can be omitted, however, spacer 48 prevents SiGe layer 52 from nucleating and epitaxially growing outward from sidewall surface 50 resulting in two growth fronts in SiGe layer 52. In addition, spacer 48 isolates strain produced by SiGe layer 52 in substrate 10 to the supports area of the chip, thus isolating the storage capacitor cells in the array from the strain.

Figure 4:
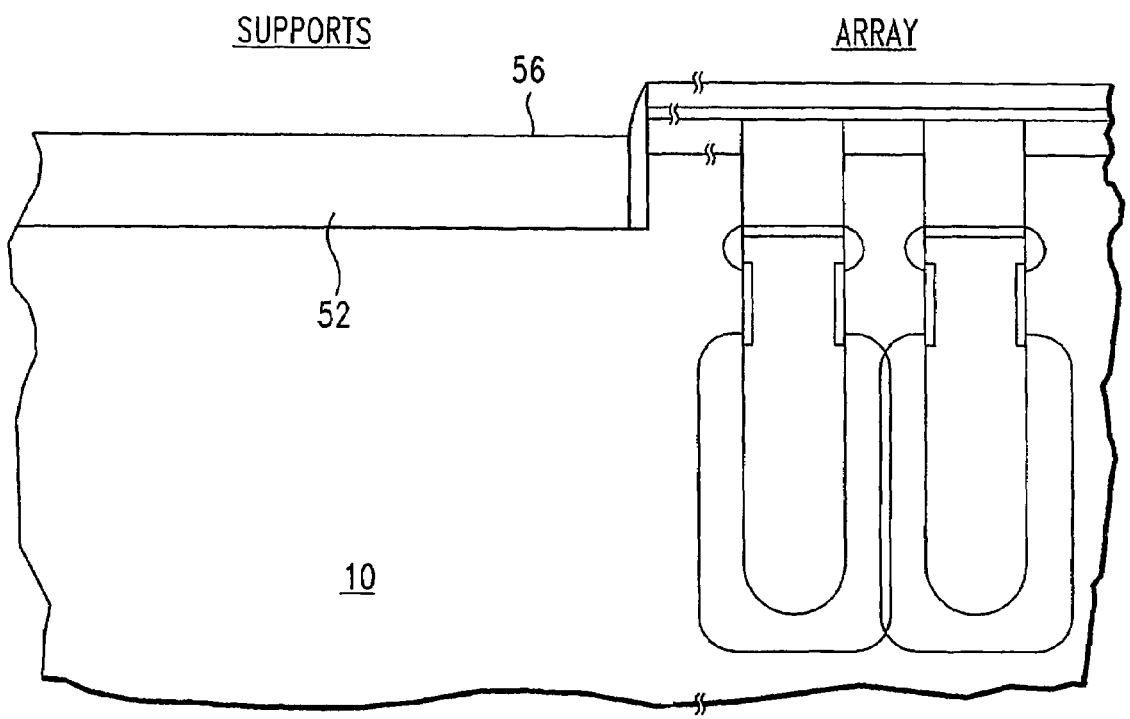

Next, upper surface 56 of SiGe layer 52 is selectively recessed by an etch process such as a reactive ion etch using an SF6 gas or an oxidation followed by an HF wet etch to a depth below the upper surface of silicon nitride layer 42, as shown in FIG. 4. Optionally, the recess of SiGe layer 52 may be omitted, since the subsequently grown strained layer is very thin.

Figure 5:
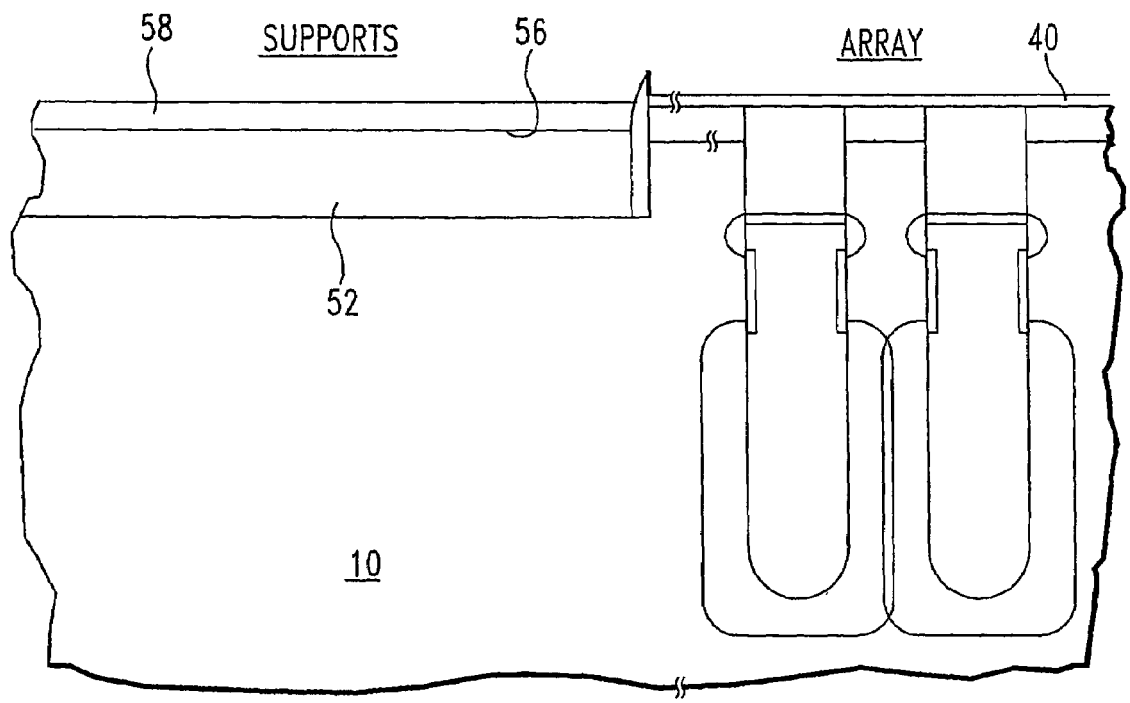

Referring to FIG. 5, a thin layer of epitaxial silicon 58 is selectively grown on upper surface 56 of SiGe layer 52. Epitaxial silicon layer 58 is grown to a thickness preferably less than about 50 nm, more preferably from about 2.5 nm to about 10 nm. Due to the lattice mismatch between SiGe layer 52 and thin epitaxial silicon layer 58, epitaxial silicon layer 58 undergoes a tensile lattice strain which enhances the mobility of subsequently formed PETs. After the growth of epitaxial silicon layer 58, silicon nitride layer 42 is removed selective to oxide layer 40 and epitaxial silicon layer 58 by processes known in the art, such as a wet etch comprising hot phosphoric acid. It should be noted that strained layer 58 can also be formed by other methods such as, for example, depositing titanium (Ti) or Cobalt (Co) metal on upper surface 56 of SiGe layer 52 and forming a thin layer of titanium silicide or cobalt silicide. Another example of forming strained layer 58 includes implanting into upper surface 56 of SiGe layer 52 an element having a lattice constant different than SiGe such as, for example, carbon (C) or germanium (Ge).

Figure 6:
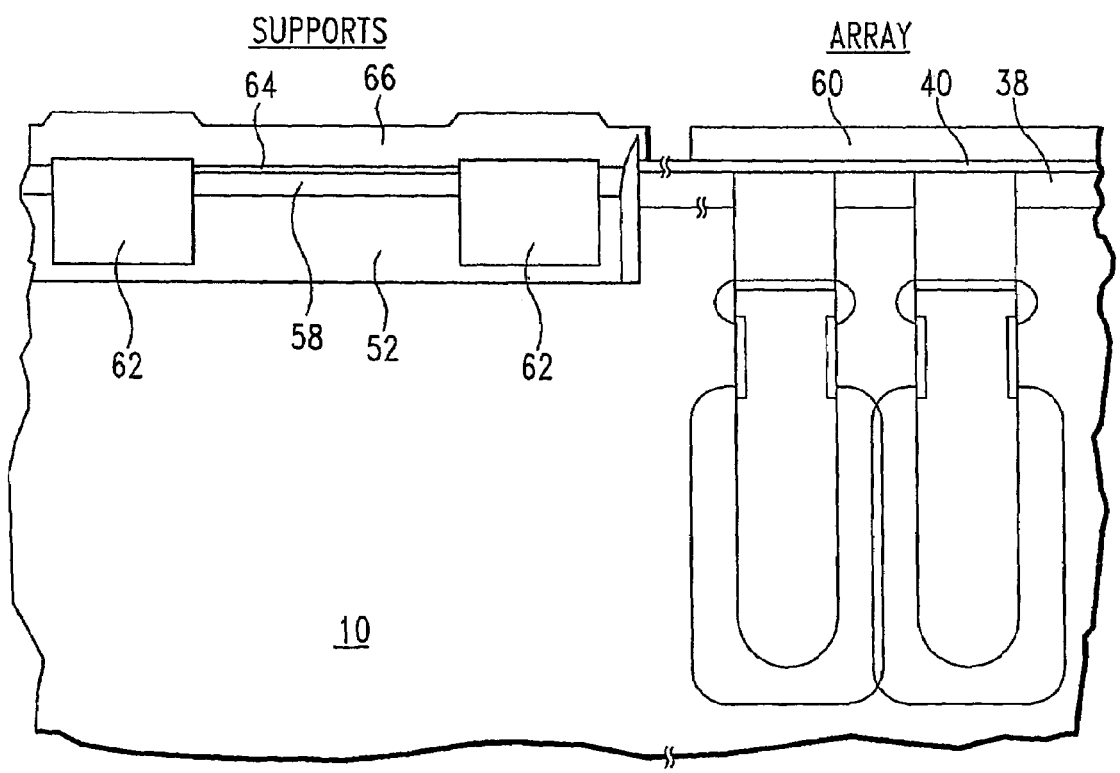

Referring to FIG. 6, a silicon nitride layer 60 is deposited on oxide layer 40 and strained silicon layer 58, and it is then patterned to expose the supports while the arrays remain covered. The active areas in the supports are patterned to form shallow trench isolations (STI) 62, that are filled using known methods, such as TEOS CVD oxide or HDP oxide, followed by planarizing. Sacrificial oxide (not shown) is grown in the supports and well implants (not shown) are formed. Sacrificial oxide is removed and support gate dielectric 64 is formed on strained silicon layer 58 by growing a thin dielectric film, such as thermal oxide or nitrided oxide. Support gate conductor 66 is formed in the strained layer region (supports), and portions of gate conductor 66 remaining in the strained layer region (array) are removed using a block mask.

Figure 7:
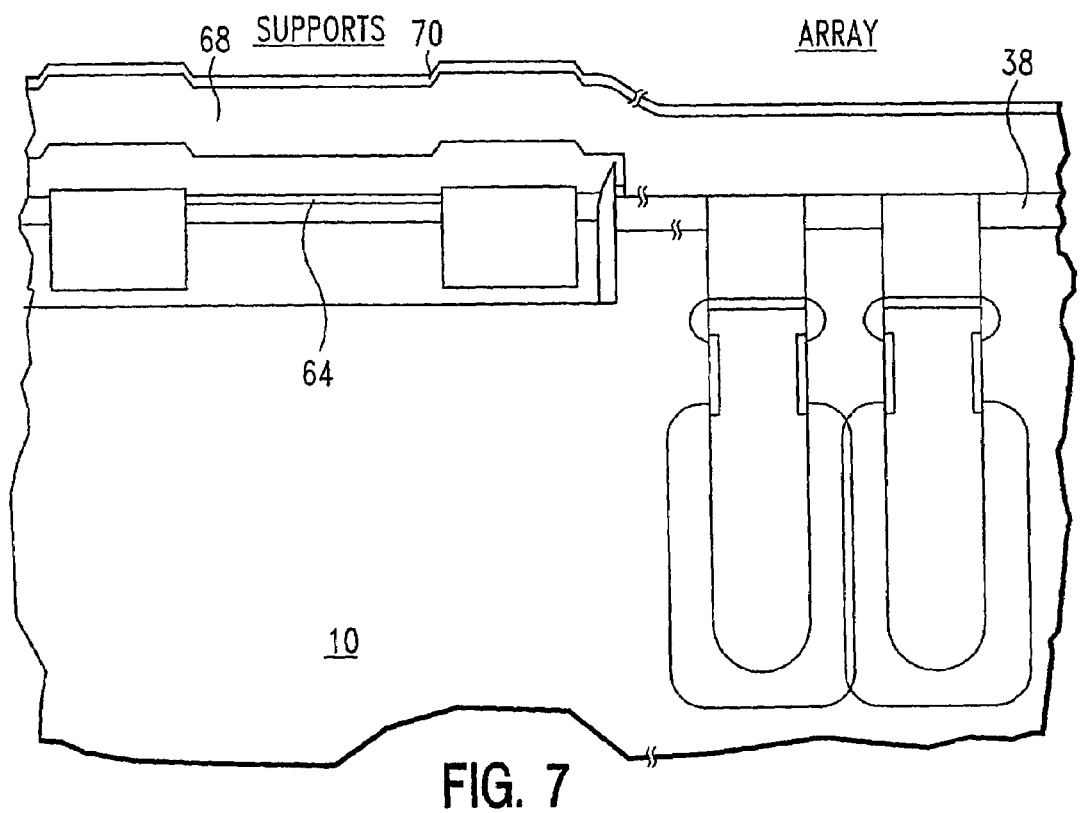

Referring to FIG. 7, silicon nitride layer 60 is removed from the array selective to oxide layer 40 by methods known in the art, such as a wet etch comprising hot phosphoric acid. Oxide layer 40 is then removed selective to silicon nitride layer 38. Wordline conductor 68, such as tungsten/tungsten silicide, and cap layer such as silicon nitride 70, are deposited in the support and array regions.

Figure 8:
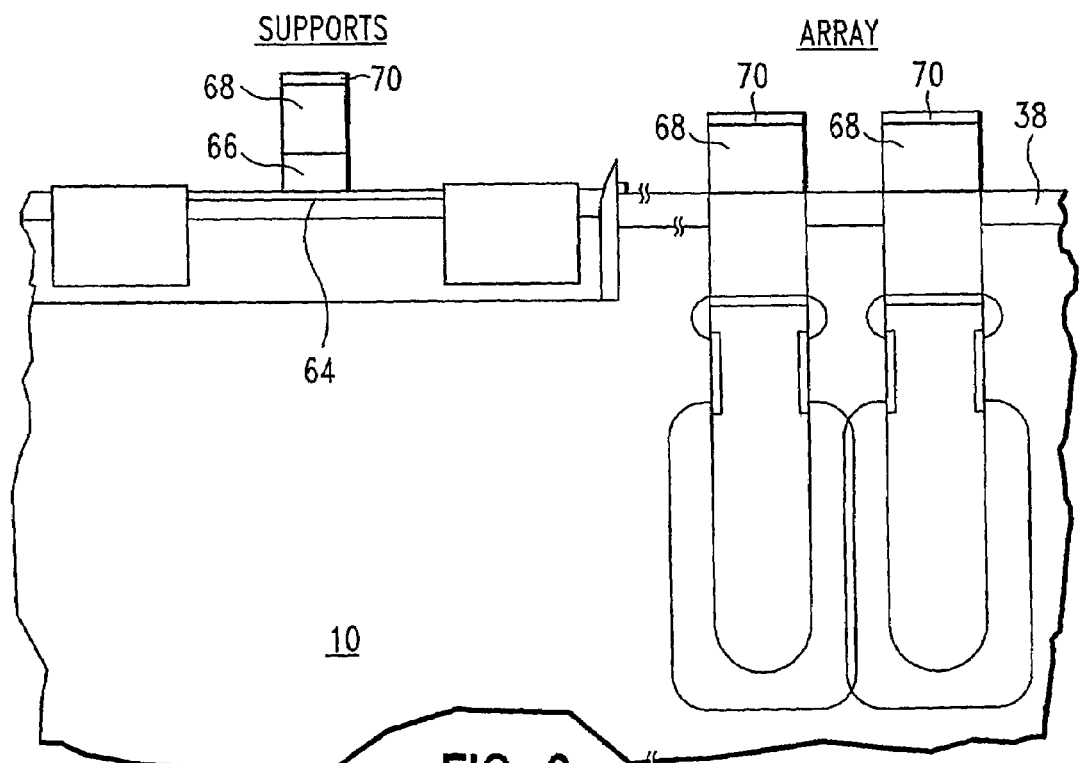

Referring to FIG. 8, support gate 66, wordlines 68 and cap layer 70 are simultaneously patterned and etched with a common mask. Optionally, two masks could be used to form support gate 66 and wordlines 68. For example, one mask could be used to form support gate 66 while another mask could be used to form wordlines 68 in order to individually optimize specific properties of each, such as linewidth for performance considerations.

Standard processing follows, which includes: support S/D extension, halo and contact implants; gate sidewall oxidation to heal any damage due to gate etch; spacer formation; support and bitline contact studs; interlevel dielectrics; and, deposition and patterning of upper layers of wiring, including bitline conductors.

Additionally, if propagation of silicon dislocations from the strained layer SiGe region into the strained layer-free memory array is a concern, dummy deep storage trenches may be used as a buffer between the strained layer (supports) and the strained layer-free (array) regions.

While the invention has been described above with reference to the preferred embodiments thereof, it is to be understood that the spirit and scope of the invention is not limited thereby. Rather, various modifications may be made to the invention as described above without departing from the overall scope of the invention as described above and as set forth in the several claims appended hereto.

What is claimed is:

1. A semiconductor structure comprising:
   a semiconductor substrate having a strained layer-free region and a strained layer region,
   wherein the strained layer region has a trench selectively formed in the substrate, and comprises: a SiGe layer formed in the trench, and an epitaxial silicon layer formed on the SiGe layer;
   a first device formed in the strained layer-free region of the semiconductor substrate; and
   a second device formed in the strained layer region of the semiconductor substrate.

2. The semiconductor structure of claim 1, wherein the first device comprises a memory cell and the second device comprises an FET.

3. The semiconductor structure of claim 2, wherein the memory cell is a low-leakage DRAM cell and the FET is a MOSFET logic device.

4. The semiconductor structure of claim 1, wherein the epitaxial silicon layer is from about 2.5 to about 10 nm thick.

5. The semiconductor structure of claim 1, wherein the SiGe layer is epitaxially grown.

6. The semiconductor structure of claim 1, wherein the strained layer region further comprises a spacer formed on a sidewall of the trench, the spacer isolating strain produced in the strained layer region from the strained layer-free region.

7. The semiconductor structure of claim 1, wherein the trench is from about 100 nm to about 400 nm deep.

8. A method for fabricating a semiconductor structure comprising the steps of:
   a) providing a semiconductor substrate having a strained-layer free region;
   b) forming a first device in the strained layer-free region of the semiconductor substrate;
   c) selectively forming a strained layer region in the semiconductor substrate comprising:
      i) forming a trench having a bottom surface and a sidewall surface;
      ii) forming a layer of SiGe in the trench; and
      iii) forming a layer of silicon on the layer of SiGe; and
   d) forming a second device in the strained layer region.

9. The method of claim 8, wherein step (ii) comprises epitaxially growing the layer of SiGe.

10. The method of claim 8, wherein step (iii) comprises epitaxially growing the layer of silicon.

11. The method of claim 8, wherein the layer of silicon is from about 2.5 rim to about 10 rim thick.

12. The method of claim 8, wherein after step (i), forming a spacer on the sidewall surface.

13. The method of claim 8, wherein the first device comprises a memory cell and the second device comprises an FET.

14. The method of claim 13, wherein the memory cell is a low-leakage DRAM cell and the FET is a MOSFET logic device.

* * * * *